(12) United States Patent
Sakaguchi

(10) Patent No.: US 8,659,220 B2
(45) Date of Patent: Feb. 25, 2014

(54) ORGANIC ELECTROLUMINESCENT LIGHTING DEVICE

(75) Inventor: Yoshikazu Sakaguchi, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 0 days.

(21) Appl. No.: 13/698,845

(22) PCT Filed: May 20, 2011

(86) PCT No.: PCT/JP2011/061638
§ 371 (c)(1),
(2), (4) Date: Nov. 19, 2012

(87) PCT Pub. No.: WO2011/155306
PCT Pub. Date: Dec. 15, 2011

(65) Prior Publication Data
US 2013/0093316 A1    Apr. 18, 2013

(30) Foreign Application Priority Data
Jun. 7, 2010    (JP) .................. 2010-130009

(51) Int. Cl.
*H01L 51/52*    (2006.01)
(52) U.S. Cl.
USPC .......................... 313/505; 313/504
(58) Field of Classification Search
USPC ............................. 313/498–512
See application file for complete search history.

(56) References Cited

U.S. PATENT DOCUMENTS

| 6,320,312 B1 * | 11/2001 | Kim et al. ............. 313/506 |
| 2004/0251825 A1 | 12/2004 | Kato et al. | |
| 2006/0214157 A1 | 9/2006 | Kawauchi et al. | |
| 2008/0088227 A1 | 4/2008 | Lee | |
| 2009/0002338 A1 * | 1/2009 | Kinoshita et al. ............. 345/174 |
| 2009/0122210 A1 * | 5/2009 | Im .................. 349/15 |
| 2011/0069254 A1 * | 3/2011 | Takama et al. ............. 349/62 |

FOREIGN PATENT DOCUMENTS

| JP | 2002-050468 | 2/2002 |
| JP | 2004-014128 | 1/2004 |
| JP | 2004-363040 | 12/2004 |
| JP | 2006-202717 | 8/2006 |
| JP | 2008-103305 | 5/2008 |
| JP | 2010-108851 | 5/2010 |
| JP | 2010-146821 | 7/2010 |
| JP | 2010-244885 | 10/2010 |

OTHER PUBLICATIONS

International Search Report, PCT/JP2011/061638, Jun. 28, 2011.

* cited by examiner

*Primary Examiner* — Donald Raleigh
(74) *Attorney, Agent, or Firm* — Young & Thompson

(57) ABSTRACT

An organic electroluminescent lighting device includes: a pair of rectangular electrode films stacked to face each other sandwiching an organic light-emitting element, and different from each other in polarity; wherein a first electrode film includes power supply terminal sections which are each of edge sides which face each other at a surface of the first electrode film; and auxiliary electrode film group including at least one of a plurality of first auxiliary electrode films and a plurality of second auxiliary electrode films located away from each other on the surface of the first electrode film. A sectional area viewed where the plurality of first auxiliary electrode films cuts perpendicularly to the edge sides increases relative to increasing distance from the edge sides. A sectional area viewed where the plurality of second auxiliary electrode films cuts parallel to the edge sides increases relative to increasing distance from the edge sides.

9 Claims, 10 Drawing Sheets

ORGANIC ELECTROLUMINESCENT LIGHTING DEVICE

TECHNICAL FIELD

The present invention relates to an organic electroluminescent lighting device that uses, as a light source, a light-emitting element including an organic light-emitting film held between a pair of electrode films different from each other in polarity.

BACKGROUND ART

One of the illumination devices is an organic electroluminescent lighting device that uses, as a light source, a light-emitting element including an organic light-emitting film held between a pair of electrode films different from each other in polarity. In the organic electroluminescent lighting device, the organic light-emitting film emits light when an electric field is generated between the pair of electrode films. The light of the organic light-emitting film is transmitted through one of the electrode films to be applied to the outside. Accordingly, one of the electrode films is made of a transparent metallic material such as ITO (indium tin oxide), ZnO, or SnO2 (NESA glass).

However, the aforementioned transparent metallic material has relatively high resistance. Further, in the electrode film, generally, each of the opposite edge sides of its surface is a power supply terminal. Thus, in the electrode film, wiring resistance increases farther away from each edge side. The increase of the wiring resistance is accompanied by the increase of a descending voltage. This disables uniform application of a voltage to the entire organic light-emitting film. The brightness of the organic light-emitting film depends on the voltage. Thus, when the voltage is not uniformly applied to the organic light-emitting film, there is a possibility that the brightness of the organic light-emitting film is not uniform.

Patent Literature 1 (JP2004-14128A) has therefore disclosed an organic electroluminescent lighting device for preventing the occurrence of the brightness nonuniformity of the organic light-emitting film. The organic electroluminescent lighting device disclosed in Patent Literature 1 includes auxiliary electrodes made of materials having a lower resistance than a transparent electrode and arranged on a grid pattern in the surface of the transparent electrode. According to this organic electroluminescent lighting device, the resistance value of the entire transparent electrode is reduced by forming, in the transparent electrode, auxiliary electrodes that have a lower resistance than the transparent electrode. The wiring resistance accordingly drops to reduce the value of the descending voltage. As a result, the brightness nonuniformity of the organic light-emitting film can be prevented.

CITATION LIST

Patent Literature 1: JP2004-14128A

SUMMARY OF INVENTION

Problems to be Solved by Invention

However, in the organic electroluminescent lighting device described in Patent Literature 1, the auxiliary electrodes are similar in shape (width and film thickness) and arranged at equal intervals in the surface of the transparent electrode. Thus, when the voltage is applied to the entire transparent electrode from each of the edge sides of the transparent electrode, voltage reduction occurs more away from the edge side (closer to the center from the edge side). As a result, a voltage distribution varies in the transparent electrode, causing variance on a voltage distribution in the organic light-emitting film. Thus, brightness uniformity is insufficient in the organic electroluminescent lighting device described in Patent Literature 1.

It is therefore an object of the present invention to provide an organic electroluminescent lighting device that can improve brightness uniformity.

Solution to Problem

To achieve the object, an organic electroluminescent lighting device according to the present invention includes: an organic light-emitting film; a pair of electrode films that are stacked to face each other sandwiching the organic light-emitting element; wherein the pair of electrode films are formed rectangular and different from each other in polarity; wherein the pair of electrode films comprise power supply terminal sections which are connected to the power source; wherein power supply terminal sections are each of edge sides which face each other at a surface of one of the electrode films; and an auxiliary electrode film group including at least one of a plurality of first belt-like auxiliary electrode films and a plurality of second belt-like auxiliary electrode films; wherein the first auxiliary electrode films extend in a direction parallel to the edge sides and the second auxiliary electrode films extend in a direction perpendicular to the edge sides; wherein the first auxiliary electrode films and the second auxiliary electrode films are located away from each other on the surface of one of the electrode films. A sectional area viewed at a section where the plurality of first auxiliary electrode films is cut in the direction perpendicular to the edge sides becomes larger in relation to increasing distance from the edge sides, and a sectional area viewed at a section where the plurality of second auxiliary electrode films is cut in the direction parallel to the edge sides becomes larger in relation to increasing distance from the edge side.

To achieve the object, another organic electroluminescent lighting device according to the present invention includes: an organic light-emitting film; a pair of electrode films that are stacked to face each other sandwiching the organic light-emitting element; wherein the pair of electrode films are formed rectangular and different from each other in polarity; wherein the pair of electrode films comprise power supply terminal sections which are connected to the power source; wherein power supply terminal sections are each of edge sides which face each other at a surface of one of the electrode films; and a plurality of first belt-like auxiliary electrode films which are located away from each other on the surface of one of the electrode films; wherein the first auxiliary electrode films extend in a direction parallel to the edge sides. A wiring density which indicates the number of the plurality of first auxiliary electrode films on the surface of one of the electrode films becomes higher in relation to increasing distance from the edge sides.

Effects of Invention

According to the present invention, in one of the electrode films, in relation to increasing distance from each of the edge sides, the sectional area of at least one of the first auxiliary electrode film and the second auxiliary electrode film becomes larger, or the wiring density of the first auxiliary electrode film becomes higher. Thus, when a voltage is applied from each of the edge sides to the entire electrode film, it is difficult for voltage drop to occur in a region away from the edge side. As a result, since voltage distribution variance in the electrode film is prevented, voltage distribution variance in the organic light-emitting film can also be prevented. Thus, brightness uniformity is improved.

DESCRIPTION OF EMBODIMENTS

First Embodiment

Figure 1:
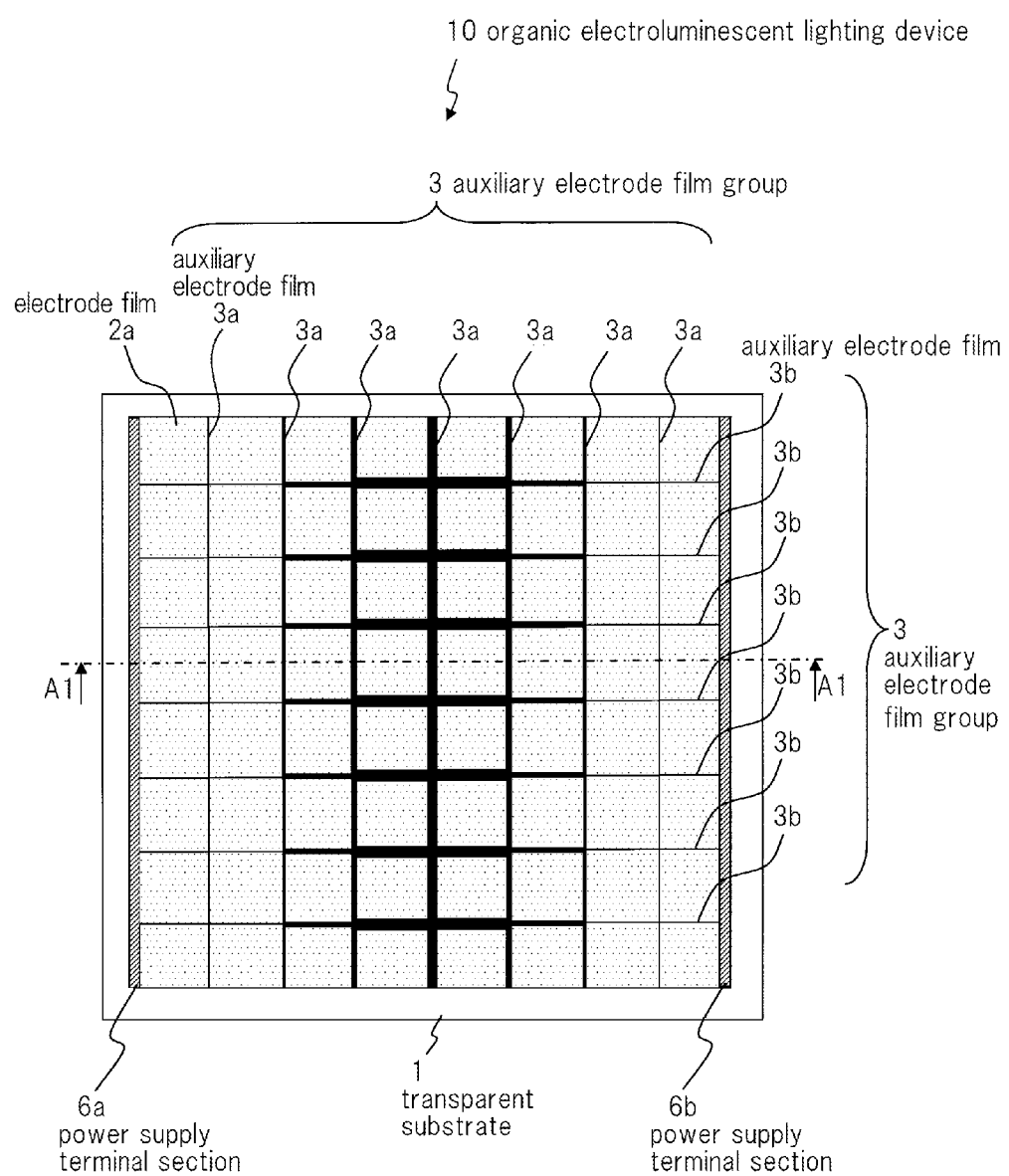
FIG. 1 A plan view showing the structure of an organic electroluminescent lighting device according to a first embodiment.
Figure 2:
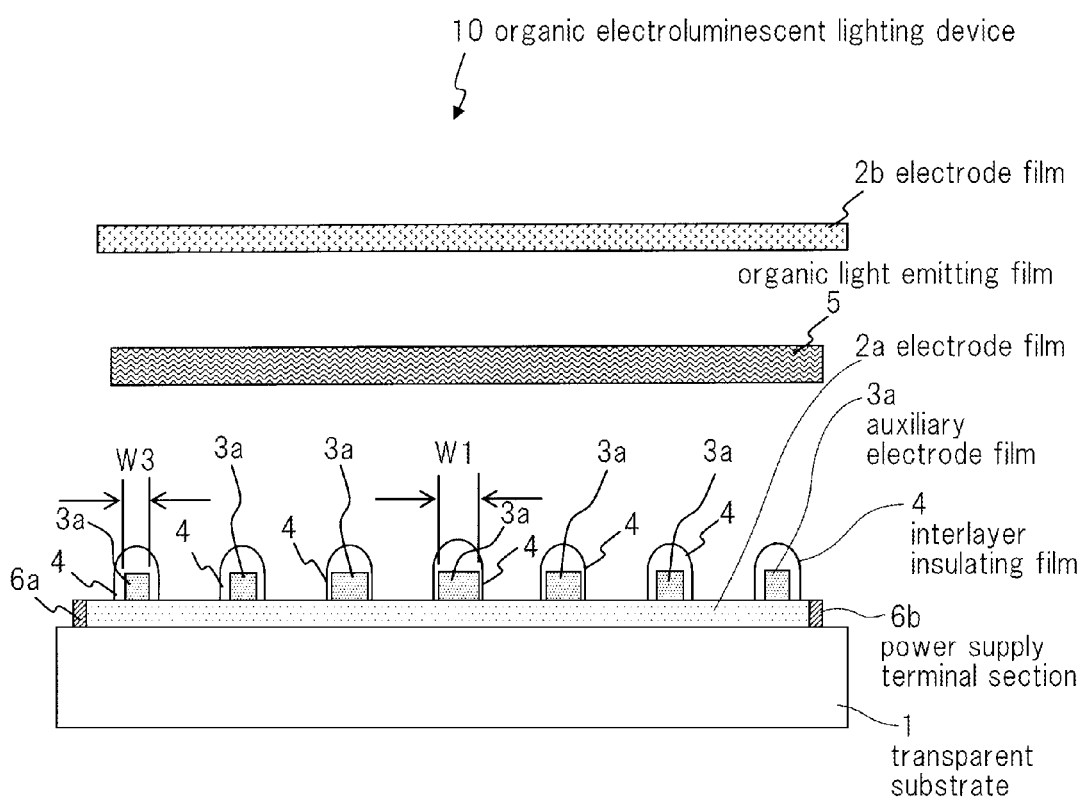
FIG. 2 A sectional view cut along line A1-A1 shown in FIG. 1.

FIG. 1 is a plan view showing the structure of organic electroluminescent lighting device 10 according to this embodiment. FIG. 2 is a sectional view cut along line A1-A1 shown in FIG. 1. In FIG. 1, for easier understanding, some (interlayer insulating film 4, organic light-emitting film 5, and electrode film 2b) of the components of organic electroluminescent lighting device 10 are not shown.

In organic electroluminescent lighting device 10, as shown in FIG. 2, rectangular electrode film 2a is formed on the surface of transparent substrate 1. Transparent substrate 1 is a glass substrate or a plastic substrate. Electrode film 2a is a positive electrode made of a transparent metallic material such as ITO, ZnO, or SnO2 (NESA glass). Edge sides opposite each other on the surface of electrode film 2a are power supply terminal sections 6a and 6b connected to the positive electrode of a power source.

Auxiliary electrode film group 3 including a plurality of belt-like auxiliary electrode films 3a (first auxiliary electrode films) and a plurality of belt-like auxiliary electrode films 3b (second auxiliary electrode films) are formed on the surface of electrode film 2a. The plurality of auxiliary electrode films 3a are located away from each other to extend in a direction parallel to power supply terminal sections 6a and 6b (edge sides of auxiliary electrode films 3a) as shown in FIG. 1. In relation to increasing distance from power supply terminal sections 6a and 6b, the width of auxiliary electrode films 3a becomes larger.

On the other hand, the plurality of auxiliary electrode films 3b are located away from each other to extend in a direction perpendicular to power supply terminal sections 6a and 6b. In relation to increasing distance from power supply terminal sections 6a and 6b, the width of each of auxiliary electrode films 3b becomes gradually larger. In relation to increasing distance from power supply terminal sections 6a and 6b, the width of each of auxiliary electrode films 3b can become continuously larger.

Figure 3:
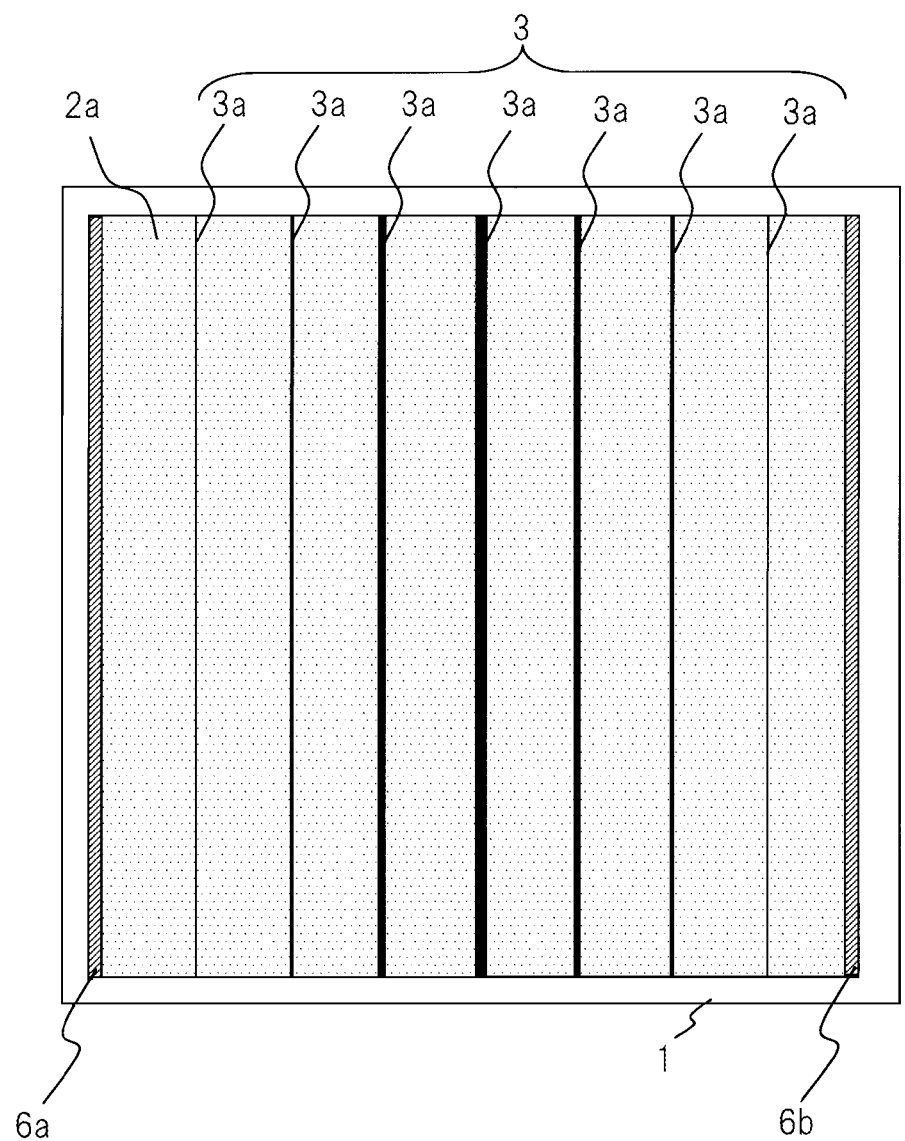
FIG. 3 A plan view showing another arrangement pattern of auxiliary electrode films in the organic electroluminescent lighting device according to the first embodiment.
Figure 4:
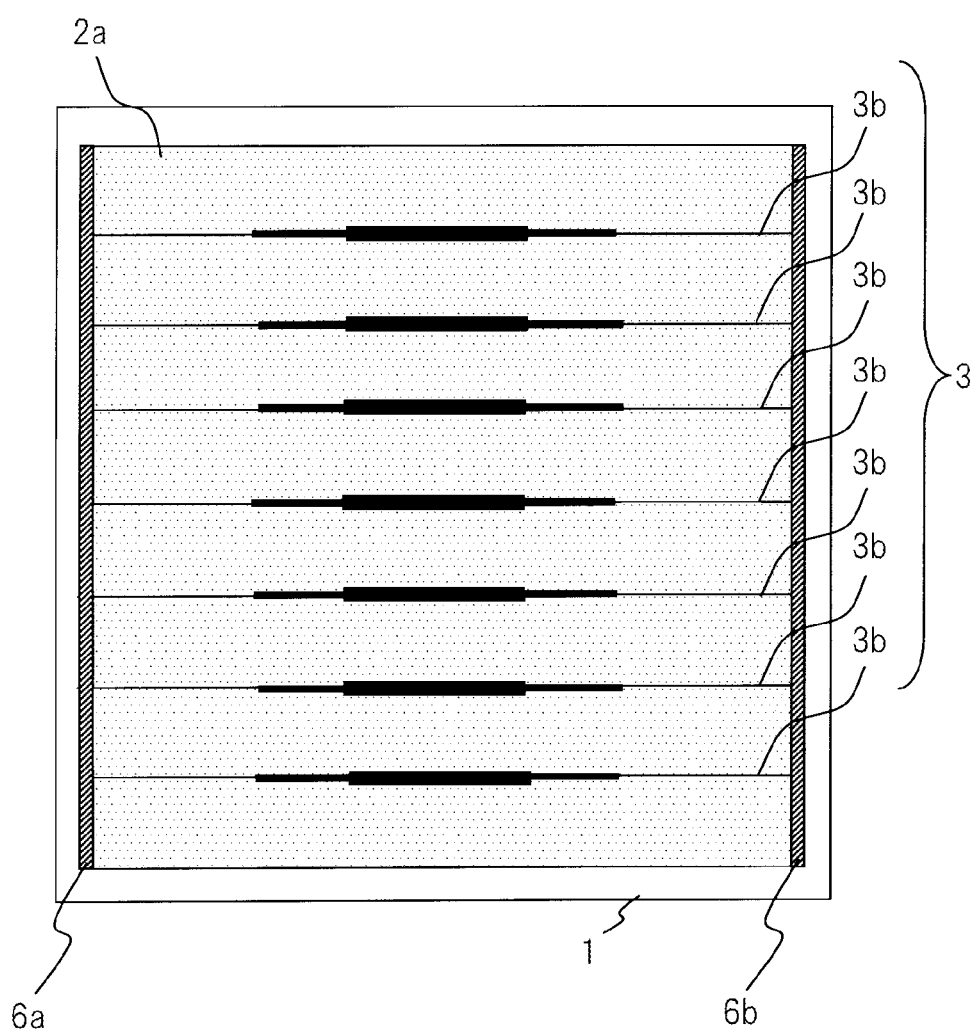
FIG. 4 A plan view showing yet another arrangement pattern of the auxiliary electrode films in the organic electroluminescent lighting device according to the first embodiment.
Figure 5:
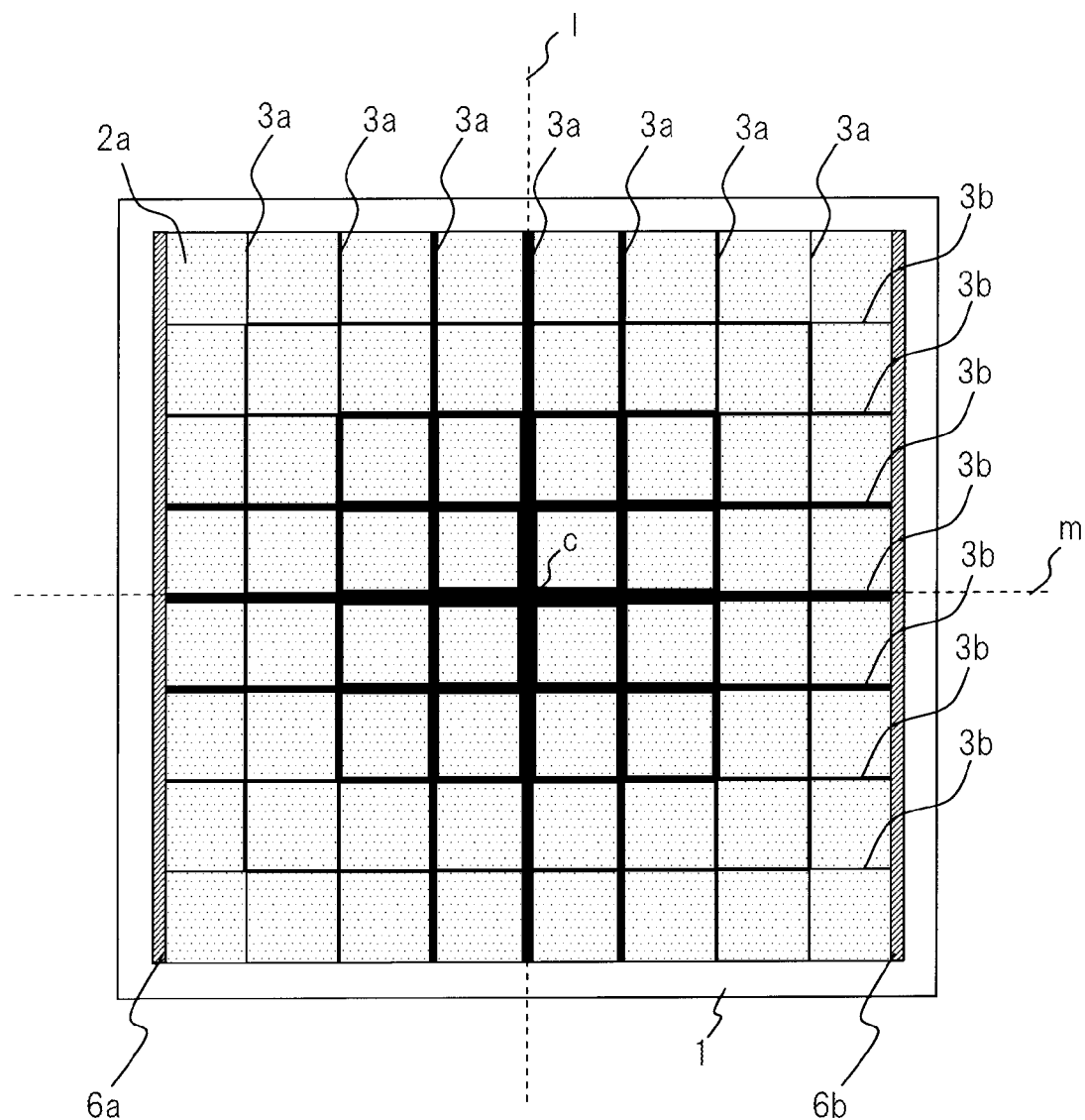
FIG. 5 A plan view showing yet another arrangement pattern of the auxiliary electrode films in the organic electroluminescent lighting device according to the first embodiment.

Auxiliary electrode films 3a and 3b are made of metallic materials whose resistance is lower than electrode film 2a, such as Cr (chromium), Al—Nd (aluminum-neodymium alloy), or Mo—Nb (molybdenum-niobium alloy). Auxiliary electrode films 3a and 3b can be two-layer films made of molybdenum and aluminum or three-layer films in which molybdenum sandwiches aluminum. In the present invention, the arrangement pattern of auxiliary electrode film group 3 is not limited to a grid pattern shown in FIG. 1. For example, as shown in FIG. 3, auxiliary electrode film group 3 can have an arrangement pattern including only a plurality of auxiliary electrode films 3a. Further, as shown in FIG. 4, auxiliary electrode film group 3 can have an arrangement pattern including only a plurality of auxiliary electrode films 3b. In this embodiment, since the plurality of auxiliary electrode films 3b is thought to function as a light shielding part, a pattern of auxiliary electrode film group 3 can be formed by taking design (symmetry) into consideration, as shown in FIG. 5. In FIG. 5, the plurality of auxiliary electrode films 3a is formed to be symmetrical with respect to first axis 1 extending in the direction parallel to power supply terminal sections 6a and 6b and second axis m extending in the direction perpendicular to power supply terminal sections 6a and 6b, which orthogonally intersect each other at center C of electrode film 2a. In relation to approaching a second axis m, the width of auxiliary electrode films 3a becomes larger. Auxiliary electrode films 3b are also formed to be symmetrical with respect to first axis 1 and second axis m, and wider closer to second axis m. In the present invention, the pluralities of auxiliary electrode films 3a and 3b can be formed on the surface of electrode film 2a that is in contacted with transparent substrate 1.

The surfaces of the pluralities of auxiliary electrode films 3a and 3b are covered with interlayer insulating film 4 (refer to FIG. 4) to prevent insulation degradation of organic light-emitting film 5. The surface of interlayer insulating film 4 is covered with organic light-emitting film 5 (refer to FIG. 2). In the present invention, there is no particular limitation on materials for interlayer insulating film 4 and organic light-emitting film 5. Conventional materials can be used. The surface of organic light-emitting film 5 is covered with electrode film 2b (refer to FIG. 2) which pairs with electrode film 2a. In this embodiment, electrode film 2b is a negative electrode made of a material whose resistance is lower than electrode film 2a, such as aluminum.

In the organic electroluminescent lighting device which does not comprise auxiliary electrode film group 3, when a voltage is applied from the light source through power supply terminal sections 6a and 6b to entire electrode film 2a, in relation to increasing distance from power supply terminal sections 6a and 6b (in relation to approaching the center of electrode film 2a), a potential becomes lower. However, in this embodiment, in relation to increasing distance from power supply terminal sections 6a and 6b, the width of auxiliary electrode films 3a becomes larger. Accordingly, a sectional area viewed at a section where the plurality of auxiliary electrode films 3a is cut in the direction perpendicular to power supply terminal sections 6a and 6b is larger in auxiliary electrode film 3a that is separated from the power supply terminal sections 6a and 6b. In this embodiment, in relation to increasing distance from power supply terminal sections 6a and 6b, the width of each of auxiliary electrode films 3b becomes larger. Accordingly, a sectional area viewed at a section where the plurality of auxiliary electrode films 3b is cut in the direction parallel to power supply terminal sections 6a and 6b is larger the further away it is from power supply terminal sections 6a and 6b.

Because of auxiliary electrode films 3a and 3b formed as described above, even when the voltage is applied from power supply terminal sections 6a and 6b to entire electrode film 2a, it is difficult for a voltage drop to occur in the region separated from power supply terminal sections 6a and 6b. As a result, voltage distribution variance in electrode film 2a is prevented. This also prevents voltage distribution variance in organic light-emitting film 5. Thus, the brightness uniformity of organic light-emitting film 5 is improved.

In this embodiment, when width W1 (refer to FIG. 2) of auxiliary electrode film 3a formed closest to the center of electrode film 2a is excessively large, a light-emitting area is reduced (light shielding area by auxiliary electrode film 3a is increased), consequently lowering illuminance. It is accordingly desirable to set width W1 to be five times larger, at a maximum, than width W3 (refer to FIG. 2) of auxiliary electrode film 3a that is formed closest to each of power supply terminal sections 6a and 6b. For auxiliary electrode film 3b, similarly, it is desirable to set the width of auxiliary electrode film 3b formed closest to the center of electrode film 2a to be five times larger, at a maximum, than the width of auxiliary electrode film 3b that is formed closest to each of power supply terminal sections 6a and 6b.

In this embodiment, the plurality of auxiliary electrode films 3a and 3b is formed on the surface of electrode film 2a. However, they can be formed on the surface of electrode film 2b, or on the surfaces of both of electrode films 2a and 2b. The surface of electrode film 2b on which the auxiliary electrode films are formed can be a surface that is in contacted with organic light-emitting film 5, or that faces (opposite) the surface of electrode film 2b.

Figure 6:
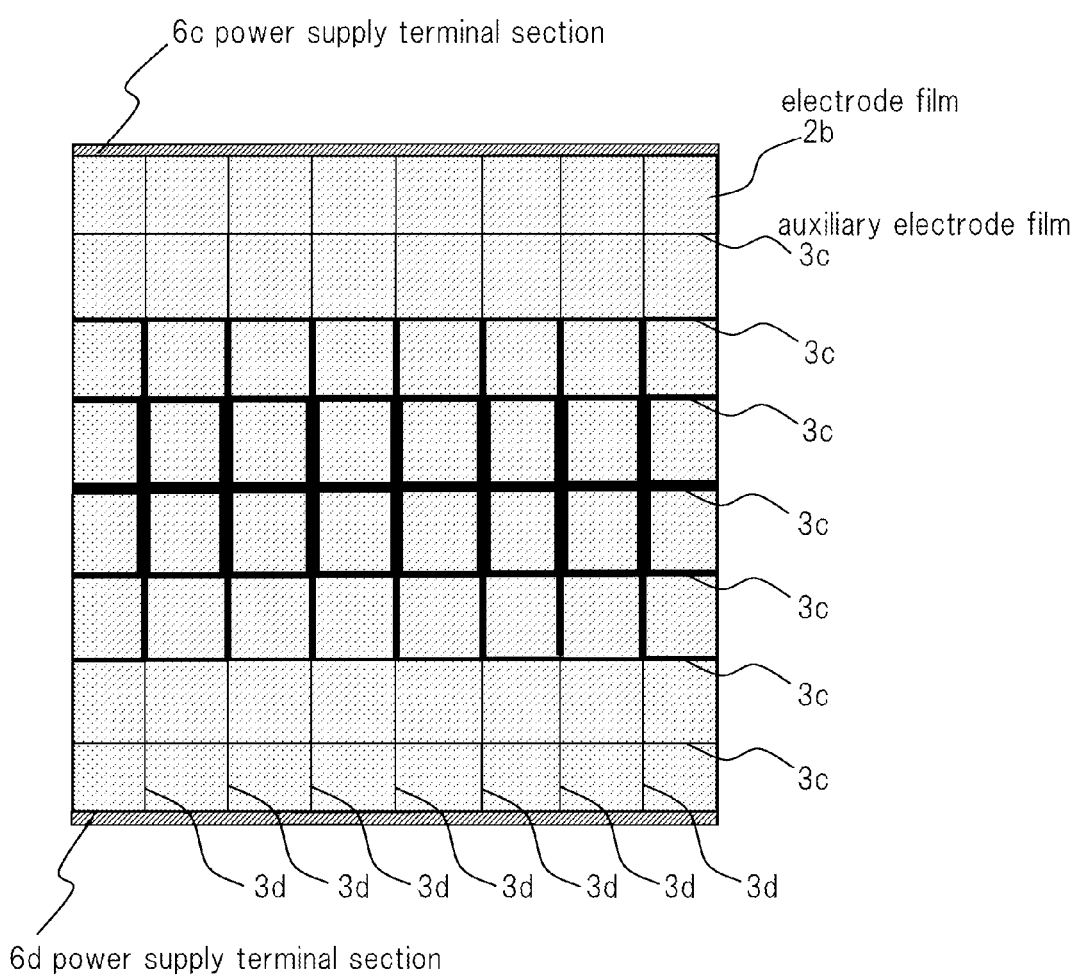
FIG. 6 A plan view showing still yet another arrangement pattern of the auxiliary electrode films in the organic electroluminescent lighting device according to the first embodiment.

FIG. 6 is a plan view showing an example of electrode film 2b in which auxiliary electrode films are formed. In FIG. 6, the opposing edge sides of the surface of electrode film 2b are power supply terminal sections 6a and 6b connected to the power source. On the surface of electrode film 2b, as in the case of electrode film 2a, a plurality of belt-like auxiliary electrode films 3c (third auxiliary electrode films) and a plurality of belt-like auxiliary electrode films 3d (fourth auxiliary electrode films) are formed. The plurality of auxiliary electrode films 3c extends in a direction parallel to power supply terminal sections 6c and 6d. On the other hand, the plurality of auxiliary electrode films 3d extends in a direction perpendicular to power supply terminal sections 6c and 6d. Materials for auxiliary electrode films 3c and 3d can be similar to those of electrode film 2b. However, it is desirable to use materials whose resistance is lower than those of electrode film 2b. This is because the resistance of entire electrode film 2b is reduced. Specifically, in the case of forming electrode film 2b made of aluminum, Ag, Au, or Cu is used. When Ag or Au is used, auxiliary electrode films 3c and 3d can be easily formed because they are formed by the same vacuum deposition device (deposition by heating) as that for forming organic light-emitting film 5. Further, when Cu is used as materials for the auxiliary electrode films, the auxiliary electrode films are formed by sputtering or CVD (chemical vapor deposition). The melting point of Cu is relatively high. Thus, it is difficult for electro migration to occur, and it is also difficult for stress migration to occur.

Second Embodiment

Organic electroluminescent lighting device 20 according to this embodiment will be described. Components similar to those of organic electroluminescent lighting device 10 according to the first embodiment are denoted by similar reference numerals, and thus detailed description thereof will be omitted.

Figure 7:
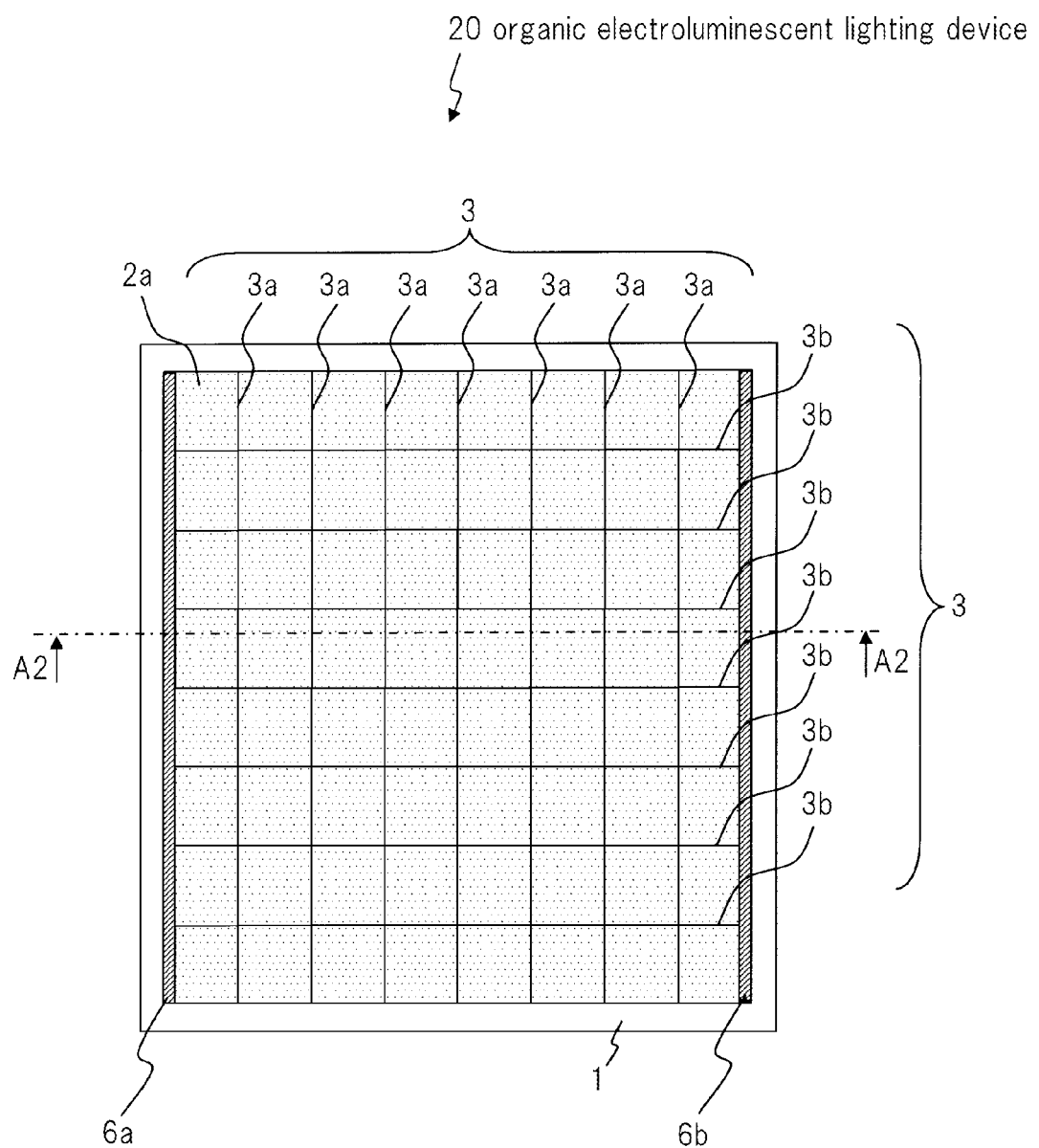
FIG. 7 A plan view showing the structure of an organic electroluminescent lighting device according to a second embodiment.
Figure 8:
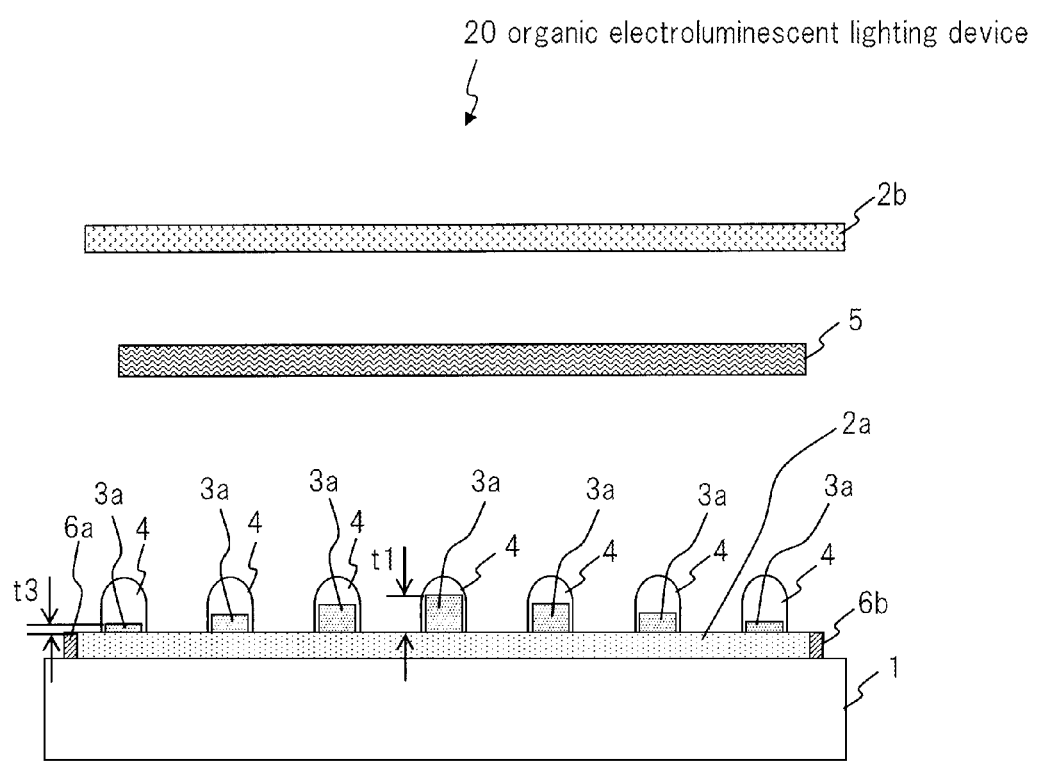
FIG. 8 A sectional view cut along line A2-A2 shown in FIG. 7.

FIG. 7 is a plan view showing the structure of organic electroluminescent lighting device 20 according to this embodiment. FIG. 8 is a sectional view cut along line A2-A2 shown in FIG. 2. In FIG. 7, for easier understanding, some (interlayer insulating film 4, organic light-emitting film 5, and electrode film 2b) of the components of organic electroluminescent lighting device 20 are not shown.

In this embodiment, auxiliary electrode films 3a are equal in width. However, in relation to increasing distance from power supply terminal sections 6a and 6b, auxiliary electrode films 3a become thicker (refer to FIG. 8). Accordingly, as in the case of the first embodiment, in relation to increases in the distance from power supply terminal sections 6a and 6b, the sectional area of each of auxiliary electrode films 3a becomes larger. Similarly, auxiliary electrode films 3b are equal in width. However, in relation increasing distance from power supply terminal sections 6a and 6b, auxiliary electrode films 3b become thicker. Accordingly, as in the case of the first embodiment, in relation to increasing distance from power supply terminal sections 6a and 6b, the sectional area of each of auxiliary electrode films 3b becomes larger.

Because of auxiliary electrode films 3a and 3b formed as described above, even when the voltage is applied from power supply terminal sections 6a and 6b to entire electrode film 2a, it is difficult for voltage drop to occur in the region that is separated from power supply terminal sections 6a and 6b. As a result, voltage distribution variance in electrode film 2a is prevented. This also prevents voltage distribution variance in organic light-emitting film 5. Thus, the brightness uniformity of organic light-emitting film 5 is improved.

In this embodiment, when thickness t1 (refer to FIG. 8) of auxiliary electrode film 3a that is formed closest to the center of electrode film 2a is excessively large, the step of auxiliary electrode film 3a is increased. Then, forming organic light-emitting film 5 and electrode film 2b after auxiliary electrode film 3a is easily made to have a non-uniform film thickness, which consequently increases the possibility that a short-circuit will occur between electrode film 2a and electrode film 2b. It is accordingly desirable to set thickness t1 to be three times larger, at a maximum, than thickness t3 (refer to FIG. 8) of auxiliary electrode film 3a that is formed closest to each of power supply terminal sections 6a and 6b. For auxiliary electrode film 3b, similarly, it is desirable to set the thickness of auxiliary electrode film 3b that is formed closest to the center of electrode film 2a to be three times larger, at a maximum, than the thickness of auxiliary electrode film 3b that is formed closest to each of power supply terminal sections 6a and 6b.

In this embodiment, a plurality of auxiliary electrode films 3c and 3d can be formed on the surface of electrode film 2b. The shapes of the plurality of auxiliary electrode films 3c and 3d can be similar to those of the first embodiment, or to those of auxiliary electrode films 3a and 3b of this embodiment.

Third Embodiment

Organic electroluminescent lighting device 30 according to this embodiment will be described. Components similar to those of organic electroluminescent lighting device 10 according to the first embodiment are denoted by similar reference numerals, and thus detailed description thereof will be omitted.

Figure 9:
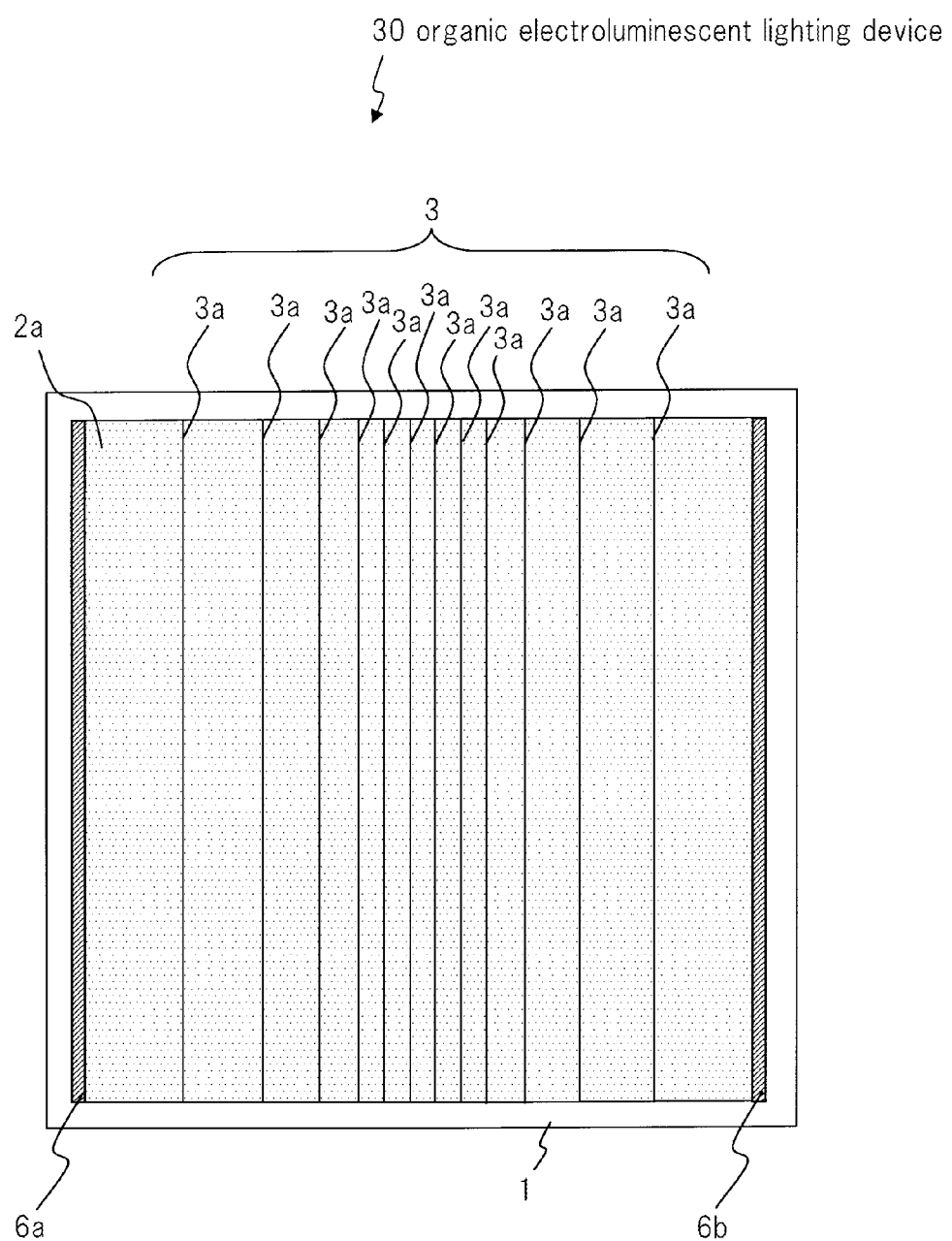
FIG. 9 A plan view showing the structure of an organic electroluminescent lighting device according to a third embodiment.

FIG. 9 is a plan view showing the structure of organic electroluminescent lighting device 30 according to this embodiment. In FIG. 9, for easier understanding, some (interlayer insulating film 4, organic light-emitting film 5, and electrode film 2b) of the components of organic electroluminescent lighting device 30 are not shown.

In organic electroluminescent lighting device 30 according to this embodiment, a plurality of auxiliary electrode films 3a are arranged at different intervals to extend in a direction parallel to edge sides of electrode film 2a. In this embodiment, a pattern of auxiliary electrode films 3a and 3b can be formed by taking symmetrical design into consideration so that a plurality of auxiliary electrode films 3a and 3b can be symmetrical with respect to first axis 1 and second axis m as shown in FIG. 10.

In this embodiment, auxiliary electrode films 3a are similar in shape (width and thickness). However, a wiring density indicates that the number of a plurality of auxiliary electrode films 3a on the surface of electrode film 2a becomes higher in relation to increasing distance from power supply terminal sections 6a and 6b. Accordingly, even when voltage is applied from power supply terminal sections 6a and 6b to entire electrode film 2a, it is difficult for voltage drop to occur in a region separated from power supply terminal sections 6a and 6b. As a result, voltage distribution variance in electrode film 2a is prevented. This also prevents voltage distribution variance in organic light-emitting film 5. Thus, the brightness uniformity of organic light-emitting film 5 is improved.

Figure 10:
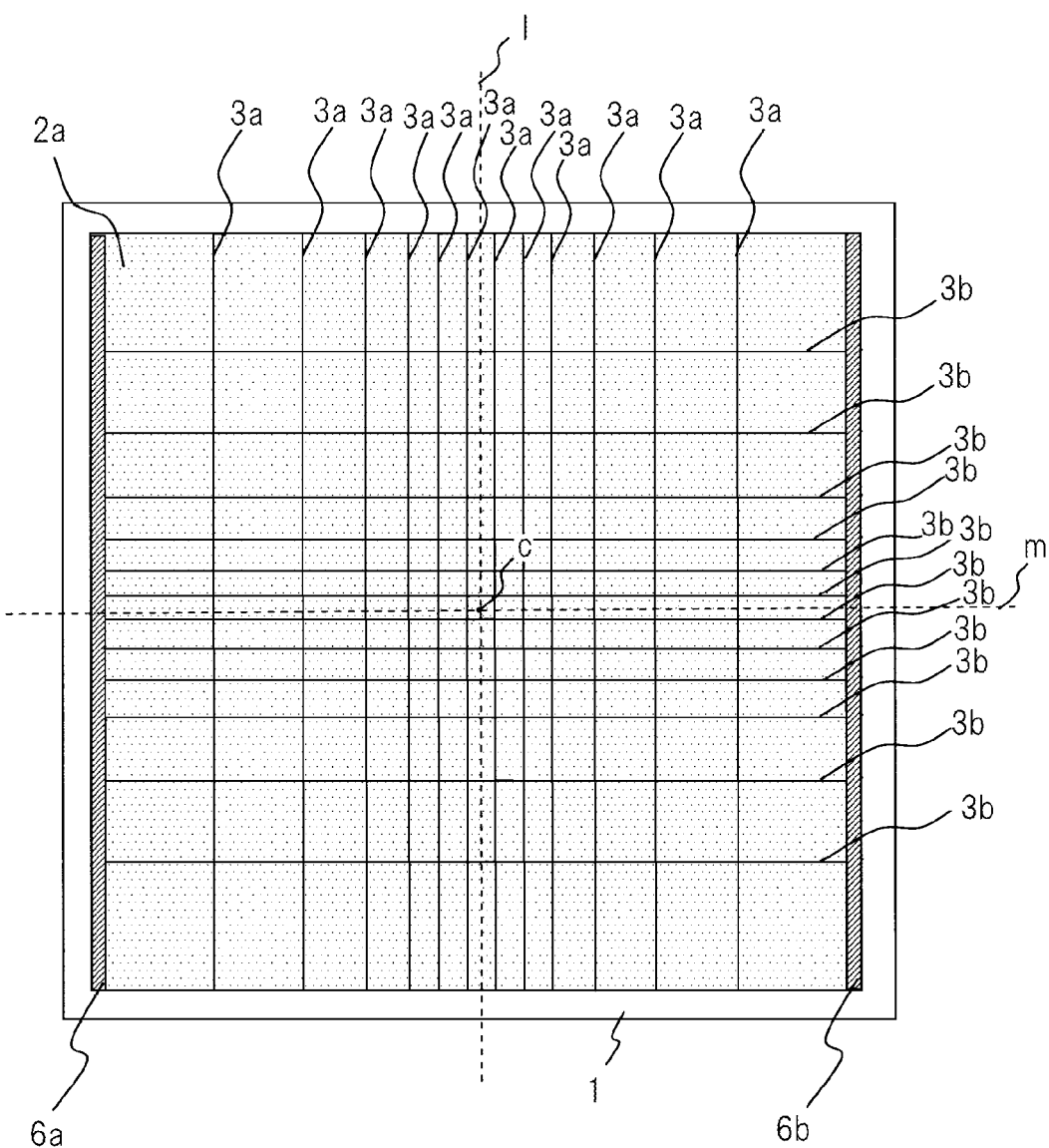
FIG. 10 A plan view showing another arrangement pattern of auxiliary electrode films in the organic electroluminescent lighting device according to the third embodiment.

In this embodiment, in the case of auxiliary electrode films 3a and 3b formed with the pattern shown in FIG. 10, when the wiring density of auxiliary electrode film 3a near center C of electrode film 2a is excessively large, the light-emitting area is reduced (light shielding area by auxiliary electrode film 3a is larger), consequently lowering illuminance. It is accordingly desirable to set the wiring density of auxiliary electrode film 3a to be five times larger, at a maximum, than that of auxiliary electrode films 3a and 3b that are formed near power supply terminal sections 6a and 6b.

In this embodiment, a plurality of auxiliary electrode films 3c similar in shape to auxiliary electrode film 3a of this embodiment can be formed on the surface of electrode film 2b. Alternatively, auxiliary electrode films 3a and 3b that have the shapes described in the first and second embodiments can be formed on the surface of electrode film 2b.

The embodiments of the present invention have been described. However, the present invention is not limited to the embodiments. Various changes understandable to those skilled in the art can be made to the configuration and the specifics of the present invention without departing from the spirit and the scope of the invention.

This application claims priority from Japanese Patent Application No. 2010-130009 filed Jun. 7, 2010, which is hereby incorporated by reference herein in its entirety.

REFERENCE NUMERALS

1 Transparent substrate
2a, 2b Electrode film
3 Auxiliary electrode film group
3a, 3b, 3c, 3d Auxiliary electrode film
4 Interlayer insulating film
5 Organic light-emitting film
6a, 6b, 6c, 6d Power supply terminal section
10, 20, 30 Organic electroluminescent lighting device

The invention claimed is:

1. An organic electroluminescent lighting device comprising:
   an organic light-emitting film;
   a pair of electrode films that are stacked to face each other sandwiching the organic light-emitting film, the pair of electrode films being rectangular and different from each other in polarity, the pair of electrode films comprising power supply terminal sections which are connected to a power source, the power supply terminal sections each being edge sides which face each other at a surface of one of the electrode films; and
   an auxiliary electrode film group including at least one of a plurality of first belt-like auxiliary electrode films and a plurality of second belt-like auxiliary electrode films, the first auxiliary electrode films extending in a direction parallel to the edge sides and the second auxiliary electrode films extending in a direction perpendicular to the edge sides, the first auxiliary electrode films and the second auxiliary electrode films being located away from each other on the surface of one of the electrode films,
   wherein a sectional area viewed at a section where the plurality of first auxiliary electrode films is cut in the direction perpendicular to the edge sides increases in relation to an increasing distance of the first auxiliary electrode films from the edge sides, and a sectional area viewed at a section where the plurality of second auxiliary electrode films is cut in the direction parallel to the edge sides increases in relation to an increasing distance of the second auxiliary electrode films from the edge sides, and
   wherein the first auxiliary electrode films and the second auxiliary electrode films are formed on the surface of one of the electrode films that is in contact with a transparent substrate.

2. An organic electroluminescent lighting device comprising:
   an organic light-emitting film;
   a pair of electrode films that are stacked to face each other sandwiching the organic light-emitting element, the pair of electrode films being rectangular and different from each other in polarity, the pair of electrode films comprising power supply terminal sections which are connected to a power source, the power supply terminal sections each being edge sides which face each other at a surface of one of the electrode films; and
   a plurality of first belt-like auxiliary electrode films which are located away from each other on the surface of one of the electrode films, the first auxiliary electrode films extending in a direction parallel to the edge sides,
   wherein a wiring density which indicates a number of the plurality of first auxiliary electrode films on the surface of one of the electrode films increases in relation to an increasing distance from the edge side, and
   wherein the first auxiliary electrode films are formed on the surface of one of the electrode films that is in contact with a transparent substrate.

3. The organic electroluminescent lighting device according to claim 1, wherein a width of each of the first auxiliary electrode films increases in relation to the increasing distance from the edge side and a width of each of the plurality of second auxiliary electrodes films increases in relation to the increasing distance from the edge side.

4. The organic electroluminescent lighting device according to claim 3, wherein the plurality of first auxiliary electrode films are symmetrical with respect to each of an extending first axis and an extending second axis extending, the first axis extending in the direction parallel to the edge side and the second axis extending in the direction perpendicular to the edge side, the first axis and the second axis orthogonally intersecting each other in the center of the surface of one of the electrode films, wherein a width of each of the plurality of first auxiliary electrode films increases in relation to approaching the second axis, and the plurality of second auxiliary electrode films is formed symmetrical with respect to each of the first axis and the second axis and a width of each of the plurality of second auxiliary electrode films increases in relation to approaching the second axis.

5. The organic electroluminescent lighting device according to claim 1, wherein a film thickness of each of the first auxiliary electrode films increases in relation to the increasing distance of the first auxiliary electrode films from the edge side, and a film thickness of each of the plurality of second auxiliary electrode films increases in relation to the increasing distance of the second auxiliary electrode films from the edge side.

6. The organic electroluminescent lighting device according to claim 1, further comprising:

a plurality of other power supply terminal sections which is connected to the power source, the other power supply terminal sections are other edge sides which face each other at a surface of other electrode films; and another auxiliary electrode film group including at least one of a plurality of third belt-like auxiliary electrode films and a plurality of fourth belt-like auxiliary electrode films, the third auxiliary electrode films extending in a direction parallel to the other edge sides and the fourth auxiliary electrode films extending in a direction perpendicular to the other edge sides, wherein the third auxiliary electrode films and the fourth auxiliary electrode films are located away from each other on the surface of the other electrode films, wherein a sectional area viewed at a section where the plurality of third auxiliary electrode films is cut in the direction perpendicular to the other edge sides increases in relation to an increasing distance from the other edge sides, and a sectional area viewed at a section where the plurality of fourth auxiliary electrode films is cut in the direction parallel to the other edge sides increases in relation to an increasing distance from the other edge sides.

7. The organic electroluminescent lighting device according to claim 1, further comprising:

other power supply terminal sections which are connected to the power source, the other power supply terminal sections being other edge sides which face each other at a surface of other electrode films; and a plurality of third belt-like auxiliary electrode films which are located away from each other on the surface of the other electrode films, and which extend in a direction parallel to the other edge sides, wherein a wiring density which indicates a number of the plurality of the third auxiliary electrode films on the surface of the other of the electrode films increases in relation to an increasing distance of the third auxiliary electrode films from the other edge sides.

8. The organic electroluminescent lighting device according to claim 1, wherein the first auxiliary electrode films and the second auxiliary electrode films are formed directly on the surface of the one of the electrode films that is in contact with a transparent substrate.

9. The organic electroluminescent lighting device according to claim 2, wherein the first auxiliary electrode films are formed directly on the surface of the one of the electrode films that is in contact with a transparent substrate.

* * * * *